(12) United States Patent
Nishina et al.

(10) Patent No.: US 8,206,515 B2
(45) Date of Patent: *Jun. 26, 2012

(54) LEAD-FREE SOLDER COMPOSITION INCLUDING MICROCAPSULES

(75) Inventors: Tsutomu Nishina, Kanagawa (JP); Kenji Okamoto, Kanagawa (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 176 days.

This patent is subject to a terminal disclaimer.

(21) Appl. No.: 12/461,982

(22) Filed: Aug. 31, 2009

(65) Prior Publication Data

US 2009/0320960 A1 Dec. 31, 2009

Related U.S. Application Data

(62) Division of application No. 10/482,056, filed on Oct. 8, 2004, now Pat. No. 7,601,228.

(30) Foreign Application Priority Data

Jun. 29, 2001 (JP) ................................. 2001-200025

(51) Int. Cl.
B23K 35/34 (2006.01)
(52) U.S. Cl. ........................................... 148/24; 148/23
(58) Field of Classification Search ............... 148/24, 148/25

See application file for complete search history.

(56) References Cited

U.S. PATENT DOCUMENTS

| | | | |
|---|---|---|---|
| 4,619,715 A | 10/1986 | Hwang | 148/23 |
| 4,820,344 A | 4/1989 | Geke et al. | 106/14.13 |
| 5,088,189 A | 2/1992 | Brown | |
| 5,116,433 A | 5/1992 | Davis et al. | 148/24 |
| 5,127,968 A | 7/1992 | Gomi et al. | |
| 5,167,729 A | 12/1992 | Takemoto et al. | 148/23 |
| 5,417,771 A | 5/1995 | Arita et al. | 148/23 |
| 5,443,659 A | 8/1995 | Nonogaki et al. | 148/23 |
| 5,698,160 A | 12/1997 | Chen et al. | 420/557 |
| 5,851,311 A | 12/1998 | Diamant et al. | |
| 5,904,782 A | 5/1999 | Diep-Quang | |
| 5,989,362 A | 11/1999 | Diamant et al. | |
| 6,054,761 A | 4/2000 | McCormack et al. | 257/698 |
| 6,159,304 A | 12/2000 | Noguchi et al. | 148/23 |
| 6,217,671 B1 | 4/2001 | Henderson et al. | 148/23 |
| 6,217,987 B1 | 4/2001 | Ono et al. | 428/209 |
| 6,334,905 B1 | 1/2002 | Hanawa et al. | 148/23 |
| 6,416,590 B1 | 7/2002 | Hirata et al. | 148/24 |
| 6,416,863 B1 * | 7/2002 | Schulze et al. | 428/402.21 |
| 6,440,228 B1 | 8/2002 | Taguchi et al. | 148/25 |
| 6,641,679 B2 | 11/2003 | Nishina et al. | 148/24 |
| 6,881,278 B2 | 4/2005 | Amita et al. | 148/23 |
| 6,915,944 B1 | 7/2005 | Takaya et al. | 228/223 |
| 2001/0019075 A1 | 9/2001 | Abe et al. | 228/224 |
| 2003/0200836 A1 | 10/2003 | Amita et al. | 75/255 |

FOREIGN PATENT DOCUMENTS

| | | |
|---|---|---|
| CN | 1374168 | 10/2002 |
| CN | 1374168 A | 10/2002 |
| EP | 0 413 312 A1 | 2/1991 |
| EP | 0413312 A1 | 2/1991 |
| GB | 2 293 342 | 3/1996 |
| GB | 2293342 | 3/1996 |
| JP | 405192786 | 8/1993 |
| JP | 405192786 A | 8/1993 |
| JP | 405337687 | 12/1993 |
| JP | 405337687 A | 12/1993 |
| JP | 06-092035 | 4/1994 |
| JP | 08025083 A * | 1/1996 |
| JP | 08-164496 | 6/1996 |
| JP | 08-164496 A | 6/1996 |
| JP | 09-327789 | 12/1997 |
| JP | 09-327789 A | 12/1997 |
| JP | 10-034383 | 2/1998 |
| JP | 10-034383 A | 2/1998 |
| JP | 2000-216300 | 8/2000 |
| JP | 2000-216300 A | 8/2000 |
| JP | 3105505 B1 | 11/2000 |
| JP | 3105505 B1 | 11/2000 |
| JP | 2001-138089 | 5/2001 |
| JP | 2001-138089 A | 5/2001 |
| JP | 2002-239785 | 8/2002 |
| JP | 2002-239785 A | 8/2002 |
| WO | WO96/37336 | 11/1996 |
| WO | WO 96/37336 | 11/1996 |
| WO | WO-96/37336 | 11/1996 |

OTHER PUBLICATIONS

Citric Acid, Anhydrous; MSDS No. C4735 [Online]; Mallinckrodt Baker; Phillipsburg, NJ, Nov. 21, 2008. http://www.jtbaker.com/msds/englishhtml/C4735.htm (accessed Apr. 13, 2009). Abstract of Murata et al. (JP 09-327789).

* cited by examiner

Primary Examiner — Roy King
Assistant Examiner — Christopher Kessler
(74) Attorney, Agent, or Firm — Rabin & Berdo, P.C.

(57) ABSTRACT

A lead-free, cream solder composition that is printable includes a SnZn alloy which is lead-free and which is a powder; a solder flux including an epoxy resin; microcapsules that are organic carboxylic acid particles encapsulated with a resin selected from a group consisting of epoxy, polyimide, polycarbonate, polyamide, polyester, polyurea, polyolefin, and polysulfone resins; and a solvent which is a glycol. The presence of the organic carboxylic acid encapsulated with a resin as microcapsules suppresses reactivity of zinc in the SnZn alloy with the organic carboxylic acid Alternately, the solder flux may include the epoxy resin; an organic carboxylic acid; and the solvent; and microcapsules that are particles of a SnZn alloy encapsulated with the described resin. The presence of the SnZn alloy encapsulated with a resin as microcapsules suppresses reactivity of zinc in the SnZn alloy with the organic carboxylic acid so that viscosity and solderability are stabilized.

14 Claims, No Drawings

LEAD-FREE SOLDER COMPOSITION INCLUDING MICROCAPSULES

This application is a divisional application of U.S. application Ser. No.10/482,056 filed Oct. 8, 2004, now U.S. Pat. No. 7,601,228.

BACKGROUND OF THE INVENTION

1. Field of the Invention

The present invention relates to a lead-free solder composition which does not require flux removal and which undergoes few changes with time in its printability and solderability.

2. Background Art

Most conventional flux for solder comprises rosin or rosin-modified resin with an activator such as organic acid or halide added thereto. Rosin is the main component of flux, and when it is diluted with solvent to have a suitable viscosity, it may improve the printability of solder that comprises it. As adhesive, in addition, rosin acts to temporarily fix electronic parts to a printed circuit substrate to prevent them from dropping or shifting. Rosin contains an active ingredient of abietic acid, and even the acid alone may be effective in some degree for solderability. Rosin that may be used in cream solder flux includes, for example, natural rosin, polymerized rosin, disproportionated rosin, hydrogenated rosin, maleic acid-modified rosin. However, rosin-based flux that contains such rosin remains as a residue on printed circuit boards after using the flux to mount electronic parts, and, in many cases, the residue has caused substrate corrosion and migration. In addition, when the printed circuit board with the residue remaining thereon is encapsulated with resin (e.g., silicone gel, epoxy resin), the residue may cause curing failure in resin encapsulation and may therefore have some negative influence on the resin's adhesiveness to and insulation from backboard. To remove the residue, the soldered board is generally washed with a flon substitute or organic solvent. At present, however, the washing agent is limited owing to environmental problems with flon and VOC.

An epoxy flux is a type of flux that does not cause substrate corrosion and migration and does not cause curing failure in resin encapsulation, even though its residue is not removed through washing. The epoxy flux mainly comprises an epoxy resin, a carboxylic acid, an amine and a thixotropic agent. When parts are mounted on a printed circuit board by the use of cream solder that contains an epoxy flux comprising such components, the solder is so planned that the conductor surface may be activated by the carboxylic acid in the stage of reflow-soldering. At the same time, the epoxy resin may react with the carboxylic acid to cure, and its curing may be finished when the reflowed solder has adhered to the parts. After the solder has reflowed, the cured epoxy resin remains as a flux residue. Compared with the residue from ordinary rosin-based flux, the cured epoxy resin residue does not interfere with the adhesiveness of encapsulation resin to printed circuit boards even though it is not removed after soldering. Moreover, the parts-soldered board may be directly encapsulated with resin and its insulation is good (See JP-A 2000-216300).

On the other hand, an SnPb alloy is generally employed as a solder alloy to be mixed with flux. The SnPb alloy serves well for soldering, and the melting point of its eutectic composition (63Sn37Pb) is 183° C. (low), and its soldering temperature is not higher than 250° C. Accordingly, it does not cause thermal damage to electronic parts not resistant to heat. However, solder not containing lead, that is, lead-free solder, is currently desired because of the current environmental problems caused by lead.

The alloy for lead-free solder includes Sn-based SnAg alloy and SnSb alloy. Of SnAg alloys, the composition having the lowest melting point is a eutectic composition of Sn3.5Ag with a melting point of 221° C. The soldering temperature of the solder alloy having this composition is from 260 to 280° C. and is considered to be high. When soldering is effected at such a temperature, electronic parts not resistant to heat may be thermally damaged, whereby their function may deteriorate or they may break. Among SnSb alloys, the composition having the lowest melting point is Sn5Sb, and its melting point is 235° C. on the solid phase line thereof and is 240° C. on the liquid phase line thereof, both considered to be high. Therefore, its soldering temperature is from 280 to 300° C. and is much higher than that of the Sn3.5Ag alloy. For the same reason, electronic parts not resistant to heat may be thermally damaged with this alloy.

Recently, lead-free SnZn alloy solder has become much noticed in the art, of which the melting point is lower than that of SnAg alloy and SnSb alloy. Of the SnZn alloy, for example, the eutectic composition is Sn9Zn, and its melting point is 199° C., which is near the melting point of SnPb eutectic solder. The soldering temperature of the SnZn alloy is lower than that of SnAg alloy and SnSb alloy, and the SnZn alloy may reduce thermal damage to electronic parts not resistant to heat.

However, when cream solder of lead-free SnZn alloy is prepared using conventional rosin-based flux, its printability and solderability may be almost the same as those of conventional cream solder immediately after its preparation. However, for example, when stored at room temperature for a while, the viscosity of the cream solder increases and its printability worsens and, in addition, its solderability also worsens. Further with the lapse of time, the viscosity of the SnZn-based cream solder increases more, and, as a result, the solder completely loses its printability. In that condition, even though a solvent is added to it to lower its viscosity and the thus-diluted solder is used for printing, the SnZn alloy powder therein can no longer melt and will be useless for soldering.

On the other hand, even when an SnZn alloy-based cream solder composition is produced using an epoxy flux so that flux residue removal may be omitted, it still has the same problems as those of rosin flux-containing solder with respect to viscosity, the printability and the solderability thereof.

OBJECT AND SUMMARY OF THE INVENTION

An object of the present invention is to solve the above-mentioned problems and to provide a solder composition that contains an epoxy flux and a lead-free SnZn alloy. The solder composition undergoes few changes with time in its viscosity, printability and solderability, not requiring flux removal.

The printability and the solderability of the cream solder composition that contains a lead-free SnZn alloy and an epoxy flux change with time because the Zn component of the SnZn alloy is highly reactive. The Zn component may therefore react with the component of the epoxy flux, essentially with the organic carboxylic acid in the flux with the lapse of time. As a result, when the reactivity of Zn with the organic carboxylic acid in the solder composition is suppressed, the above-mentioned problem may be solved. The invention is based on this finding.

Specifically, the first embodiment of the invention is a solder composition containing a lead-free SnZn alloy and a solder flux that contains at least an epoxy resin and an organic carboxylic acid. In this embodiment, the organic carboxylic acid is dispersed in the solder composition as a solid at room temperature (25° C.).

The second embodiment of the invention also is a solder composition containing a lead-free SnZn alloy and a solder flux that contains at least an epoxy resin and an organic carboxylic acid. In this embodiment, the organic carboxylic acid has a molecular weight of from 100 to 200 g/mol. Preferably, the organic carboxylic acid of this embodiment is dispersed in the solder composition as a solid at room temperature (25° C.).

The third embodiment of the invention likewise is a solder composition containing a lead-free SnZn alloy and a solder flux that contains at least an epoxy resin and an organic carboxylic acid. In the embodiment, the organic carboxylic acid is in microcapsules that are encapsulated with a film selected from a group consisting of epoxy resin, polyimide resin, polycarbonate resin, polyamide resin, polyester resin, polyurea resin, polyolefin resin, and polysulfone resin.

The fourth embodiment of the invention also is a solder composition containing a lead-free SnZn alloy and a solder flux that contains at least an epoxy resin and an organic carboxylic acid. The SnZn alloy of this embodiment is in microcapsules that are encapsulated with a film selected from a group consisting of epoxy resin, polyimide resin, polycarbonate resin, polyamide resin, polyester resin, polyurea resin, polyolefm resin, and polysulfone resin.

In the solder composition of the invention, the epoxy resin preferably is selected from a group consisting of bisphenol A-type epoxy resin, bisphenol F-type epoxy resin, novolak-type epoxy resin, alicyclic epoxy resin, and their mixtures.

Also, preferably the solder composition of the invention contains an alcohol. The alcohol preferably is a polyalcohol.

In the solder composition of the invention, the organic carboxylic acid preferably is selected from a group consisting of saturated aliphatic dicarboxylic acid, unsaturated aliphatic dicarboxylic acid, cycloaliphatic dicarboxylic acid, amino group-containing carboxylic acid, hydroxyl group-containing carboxylic acid, heterocyclic dicarboxylic acid, and their mixtures. The organic carboxylic acid preferably has a melting point of from 130 to 220° C.

The total content of the epoxy resin and the organic carboxylic acid in the flux preferably is from 70 to 100% by mass of the flux. The content of the alcohol therein preferably is from 0 to 30% by mass. The epoxy resin and the organic carboxylic acid preferably are so formulated in the flux that the carboxyl group is from 0.8 to 2.0 equivalents relative to 1.0 equivalent of the epoxy group therein.

Since the solder composition of the invention contains a lead-free SnZn alloy, its melting point is lower than that of other lead-free Sn-containing alloys such as SnAg and SnSb. As a result, it may reduce thermal damage of electronic parts that are not resistant to heat in reflow soldering with it. In addition, since it contains an epoxy flux, it is free from problems of substrate corrosion and migration, and does not cause curing failure in resin encapsulation. It does not require flux removal. Further, the solder composition of the invention is specifically designed so that Zn in the SnZn does not react with the organic carboxylic acid component in the flux to cause changes with time in the viscosity, the printability and the solderability of the composition. Therefore, even when stored for a long period of time after prepared, the solder composition still has long-lasting good solderability, that does not undergo such changes with time.

DETAILED DESCRIPTION OF THE PREFERRED EMBODIMENTS

As so mentioned hereinabove, the solder composition of the invention is a solder composition containing a lead-free SnZn alloy and a solder flux that contains at least an epoxy resin and an organic carboxylic acid. The lead-free SnZn alloy has a lower melting point than other lead-free Sn-based alloys such as SnAg and SnSb, and, as a result, whenever using it for reflow soldering electronic parts that are not resistant to heat, thermal damage to the parts is reduced. In addition, since the solder composition of the invention contains an epoxy flux, it does not cause substrate corrosion and migration, does not cause curing failure in resin encapsulation, and does not require flux removal.

The lead-free SnZn alloy includes, but is not limited to SnZn, SnZnBi and SnZnIn. Preferably, the SnZn alloy comprises Sn as its essential ingredient, containing from 5 to 15% by mass of Zn and at most 10% by mass of Bi or In, and has a melting point of from about 180 to 210° C. More preferred are a eutectic composition of Sn9Zn (m.p. 199° C.), and Sn8Zn3Bi (m.p. 197° C.), Sn8Zn6Bi (m.p. 194° C.) and Sn9Zn4In (m.p. 190° C.).

The epoxy resin for the flux component is liquid at room temperature (25° C.). It acts to mix with the solid (powder) solder component to give cream solder. It further acts to cure with the organic carboxylic acid in soldering to thereby convert the excess carboxylic acid into a cured product that does not require flux removal. The cured epoxy resin product does not interfere with the adhesiveness of encapsulation resin to a parts-soldered printed circuit board, even when the board is not washed but directly subjected to resin encapsulation, and, in addition, its insulation is good. Preferably, the epoxy resin is selected from bisphenol A-type epoxy resin, bisphenol F-type epoxy resin, novolak-type epoxy resin, alicyclic epoxy resin, and their mixtures. More preferably, it is a bisphenol A-type epoxy resin.

The organic carboxylic acid for the flux component acts as an activator. That is, while used in soldering, it acts to remove the oxidized film on the conductor pattern (e.g., copper) of a printed circuit board. It also acts to remove the oxidized film on the solder alloy surface so that the conductor pattern may be well wetted with the solder. In addition, the organic carboxylic acid acts to cure with the epoxy resin. The flux for use in the invention does not require any other activator (e.g., amine or halide activator) than the organic carboxylic acid therein. In the solder composition of the invention, the organic carboxylic acid preferably has a melting point of from 130 to 220° C. Of the organic carboxylic acids mentioned below, more preferred are those having a melting point of from 130 to 220° C. The reason such organic carboxylic acids having a melting point of from 130 to 220° C. are preferred for use in the invention, is that carboxylic acids having a melting point lower than 130° C. may melt before the conductor surface of the printed circuit board is activated. If the acid melts, Zn in the SnZn alloy may react with the carboxylic acid before the conductor surface activation. If such a reaction occurs, the wettability of the conductor surface will be poor. On the other hand, carboxylic acids having a melting point higher than 220° C. could hardly melt during solder reflowing, and therefore could not activate conductors and could not cure with epoxy resin.

The solder compositions of the above-mentioned embodiments of the invention are described in more detail below.

The first embodiment of the solder composition of the invention contains a lead-free SnZn alloy and a solder flux that contains at least an epoxy resin and an organic carboxylic acid. The organic carboxylic acid is dispersed in the solder composition as a solid at room temperature (25° C.).

At this temperature, the organic carboxylic acid that reacts with the Zn in the SnZn alloy is dispersed as a solid powder. Its contact with the Zn therefore is reduced to retard its reaction with the Zn, so that during storage, the solder composition hardly changes over time. When the solder composition is heated for soldering, the organic carboxylic acid melts before the SnZn alloy melts and, as a result, the acid diffuses in the solder composition. This increases its contact with the SnZn alloy or with the object face to be soldered, therefore activating the solder powder and the object face to be soldered. At the same time, on the other hand, the epoxy resin cures with the organic carboxylic acid, and the flux containing them can therefore maintain its intrinsic function.

In flux preparation, in general, a carboxylic acid that serves as an activator is heated and melted with other flux components, then stirred and cooled to give a uniform flux. According to this process, however, the carboxylic acid is liquid at room temperature like epoxy resin, and an SnZn alloy solder that comprises a flux with such a liquid carboxylic acid may undergo frequent contact between the carboxylic acid and Zn and the solder composition of the type will therefore undergo the above-mentioned changes over time. Contrary to this, the process for flux preparation is not employed in the invention. In the invention, an organic carboxylic acid-containing flux is mixed with a SnZn alloy at room temperature to prepare the solder composition of the invention. Accordingly, in the invention, the organic carboxylic acid can be dispersed in the thus-produced solder composition as a solid, and as so mentioned hereinabove, the solder composition of the invention does not change with time.

The organic carboxylic acid to be used in the above-mentioned embodiment is preferably selected from saturated aliphatic dicarboxylic acid, unsaturated aliphatic dicarboxylic acid, cycloaliphatic dicarboxylic acid, amino group-containing carboxylic acid, hydroxyl group-containing carboxylic acid, heterocyclic dicarboxylic acid, and their mixtures. Concretely, it includes succinic acid, glutaric acid, adipic acid, azelaic acid, dodecane-diacid, itaconic acid, mesaconic acid, cyclobutane-dicarboxylic acid, cyclohexane-dicarboxylic acid, cyclohexene-dicarboxylic acid, cyclopentane-tetracarboxylic acid, methyladipic acid, L-glutamic acid, citric acid, malic acid, tartaric acid, pyrazine-dicarboxylic acid, diglycolic acid, phenylene-diacetic acid, catechol-diacetic acid, thiopropionic acid, thiodibutylic acid and dithioglycolic acid.

The second embodiment of the solder composition of the invention contains a lead-free SnZn alloy and a solder flux that contains at least an epoxy resin and an organic. carboxylic acid, wherein the organic carboxylic acid has a molecular weight of from 100 to 200 g/mol. The organic carboxylic acid is characterized in that it reacts with Zn in SnZn to form a salt, in the manner mentioned below.

Conventional rosin flux contains, as the active ingredient thereof, a rosin having a large molecular weight (about 300 to 1000 g/mol). Therefore, with time, the Zn in SnZn may react with the rosin in the flux to thereby form a salt having a large molecular weight. As a result, the changes with time in viscosity, printability and solderability of cream solder that comprise the flux of this type are remarkable. However, when an epoxy flux that contains an organic carboxylic acid having a low molecular weight is used in solder, then the solder may be prevented from changing with time since the organic carboxylic acid may react with Zn to form a salt having a low molecular weight. In addition, since such a low-molecular-weight salt of the low-molecular-weight carboxylic acid with Zn is previously formed, the solder composition is prevented from being oxidized or being reacted with any other component while stored. Therefore, it is stable and undergoes few changes with time.

The molecular weight of the "organic carboxylic acid having a low molecular weight" falls between 100 and 200 g/mol, as so mentioned hereinabove. The reason why the molecular weight of the organic carboxylic acid is defined to fall between 100 and 200 g/mol is that organic carboxylic acids having a molecular weight smaller than 100 g/mol are too reactive and they may greatly react with Zn in SnZn alloys. On the other hand, organic carboxylic acids having a molecular weight larger than 200 g/mol are also unfavorable, since the molecular weight of the salt formed of such an organic carboxylic acid and Zn in the alloy may be too high and, if so, the solder may undergo changes with time. More preferably, the organic carboxylic acid has a molecular weight of from 130 to 180 mol/g.

The organic carboxylic acid to be used in this embodiment has a molecular weight of from 100 to 200 g/mol, and is preferably selected from a group consisting of saturated aliphatic dicarboxylic acid, unsaturated aliphatic dicarboxylic acid, cycloaliphatic dicarboxylic acid, amino group-containing carboxylic acid, hydroxyl group-containing carboxylic acid, heterocyclic dicarboxylic acid, and their mixtures. More concretely, it includes succinic acid, glutaric acid, adipic acid, azelaic acid, itaconic acid, citraconic acid, mesaconic acid, cyclobutane-dicarboxylic acid, cyclohexane-dicarboxylic acid, cyclohexene-dicarboxylic acid, dimethylglutaric acid, methyladipic acid, L-glutamic acid, aspartic acid, citric acid, malic acid, tartaric acid, pyridine-dicarboxylic acid, pyrazine-dicarboxylic acid, diglycolic acid, phenylene-diacetic acid, thiopropionic acid, thiodibutylic acid and dithioglycolic acid. Preferred are cyclohexene-dicarboxylic acid, L-glutamic acid, dimethylglutaric acid and itaconic acid.

The organic carboxylic acid to be in the solder composition of this embodiment may be dispersed in the solder composition as a solid at room temperature (25° C.), or may be dispersed as a liquid. When the organic carboxylic acid is dispersed as a liquid at room temperature (25° C.), the carboxylic acid that serves as an activator is heated and melted along with any other flux component, stirred and cooled to prepare a uniform flux, and then mixed with a solder alloy. So far as the above-mentioned organic carboxylic acid having a low molecular weight is used in the flux, even the SnZn alloy solder that contains the liquid carboxylic acid-containing flux may also be prevented from undergoing changes with time. However, as described above, from the viewpoint of reducing the contact between the organic carboxylic acid and Zn, it is desirable that the organic carboxylic acid is dispersed in the solder composition as a solid at room temperature (25° C.). For example, an organic carboxylic acid that is powder at room temperature is mixed with an epoxy resin to prepare a flux, and the flux may be mixed with an SnZn alloy whereby the organic carboxylic acid can be dispersed as a solid in the resulting solder composition.

The third embodiment of the solder composition of the invention contains a lead-free SnZn alloy and a solder flux that contains at least an epoxy resin and an organic carboxylic acid, wherein the organic carboxylic acid is in microcapsules. The microcapsules are formed with a film selected from a group consisting of epoxy resin, polyimide resin, polycarbonate resin, polyamide resin, polyester resin, polyurea resin, polyolefm resin, and polysulfone resin.

In the solder composition of this embodiment, the organic carboxylic acid that is highly reactive with the Zn component of the SnZn alloy at room temperature is encapsulated with an inert film of, for example, polyimide or the like. In microcapsules, therefore, the organic carboxylic acid is prevented from reacting with Zn, and the solder composition hardly undergoes any changes over time. However, when the solder receives heat while reflowing for soldering, the film is broken, the organic carboxylic acid dissolves out and activates the object face to be soldered and the solder powder. At the same time, the epoxy resin cures with the organic carboxylic acid, and the flux containing them can therefore perform its intrinsic function.

The microcapsule structure is not specifically defined as to how it may be constructed (the mode of microencapsulation). For example, it may be constructed by any known method of microencapsulation, such as interfacial polymerization, in-liquid drying, spray-drying or vacuum vapor deposition.

The organic carboxylic acid to be used in this embodiment preferably is selected from a group consisting of saturated aliphatic dicarboxylic acid, unsaturated aliphatic dicarboxylic acid, cycloaliphatic dicarboxylic acid, amino group-containing carboxylic acid, hydroxyl group-containing carboxylic acid, heterocyclic dicarboxylic acid, and their mixtures. The carboxylic acid is coated with a film of polyimide or the like to construct the microcapsules.

The fourth embodiment of the invention is a solder composition containing a lead-free SnZn alloy and a solder flux that contains at least an epoxy resin and an organic carboxylic acid, wherein the SnZn alloy is in microcapsules that are formed with a film selected from a group consisting of epoxy resin, polyimide resin, polycarbonate resin, polyamide resin, polyester resin, polyurea resin, polyolefin resin, and polysulfone resin.

In the solder composition of this embodiment, the SnZn alloy that, has as its constitutive component, Zn highly reactive with an organic carboxylic acid at room temperature, is covered with an inert film. Therefore, the Zn is protected from reacting with the carboxylic acid, and the solder composition undergoes hardly any changes with time. However, when the solder reflow receives heat while it is used for soldering, the film is broken and the solder alloy powder dissolves out of it, and when the thus-heated solder flow reaches a temperature higher than the melting point of the solder alloy, the solder melts to enable soldering.

The microcapsule structure is not specifically defined so far as the mode of the microencapsulation. For example, it may be constructed by any known method of microencapsulation, such as interfacial polymerization, in-liquid drying, spray-drying or vacuum vapor deposition.

In the solder composition of the invention, the flux component preferably contains an alcohol as a solvent thereof. The alcohol solvent dissolves the carboxylic acid in the flux to thereby lower the viscosity of the flux. In addition, the epoxy resin in the flux may react with the alcohol, and the alcohol does not remain as a residue. However, even when the flux of the invention does not contain an alcohol, it still applies to lead-free solder. Alcohols usable in the solder flux of the invention include methyl alcohol, ethyl alcohol, propyl alcohol, butyl alcohol, isobutyl alcohol, amyl alcohol, isoamyl alcohol, allyl alcohol, cyclohexanol, as well as polyalcohols such as ethylene glycol, diethylene glycol, triethylene glycol, tetraethylene glycol, propylene glycol, octylene glycol, polyethylene glycol, propanediol, and glycerin, and mixtures thereof. Preferred are polyalcohols; and more preferred are ethylene glycol, diethylene glycol, triethylene glycol, tetraethylene glycol, propylene glycol, polyethylene glycol, propanediol and glycerin.

If desired, the flux may contain other additives such as thixotropic acid, chelating agent, defoaming agent, surfactant and antioxidant. Regarding the amount of these additives in the flux, it is desirable that the thixotropic agent accounts for from 0 to 5% by weight of the flux, the chelating agent for from 0 to 5% by mass, the defoaming agent for from 0 to 1% by mass, the surfactant for from 0 to 2% by weight, and the antioxidant for from 0 to 3% by mass.

Preferably, the solder composition is so designed that the total amount of the epoxy resin and the organic carboxylic acid in the flux is from 70 to 100% by mass, and the amount of the alcohol is from 0 to 30% by mass, and the epoxy resin and the organic carboxylic acids are so formulated in the flux that the carboxyl group is from 0.8 to 2.0 equivalents relative to 1.0 equivalent of the epoxy group therein. The reason that the carboxyl group is preferred at from 0.8 to 2.0 equivalents relative to 1.0 equivalent of the epoxy group in the flux, is that, if the carboxyl group is smaller than 0.8 equivalents, the activity of the carboxylic acid will be low and the solder wettability thereby will be lowered. If, on the other hand, the carboxyl group is larger than 2.0 equivalents, too much solid carboxylic acid would worsen the flowability of the flux and the solder wettability thereby will be lowered. Preferably, the blend ratio of the epoxy resin and the organic carboxylic acid is so controlled that the carboxyl group is from 1.0 to 1.3 equivalents relative to 1.0 equivalent of the epoxy group, more preferably the carboxyl group is 1.0 equivalent. The reason the total amount of the epoxy resin and the organic carboxylic acid in the flux is preferred at from 70 to 100% by mass of the flux is that, if it is smaller than 70% by mass, the activity of the carboxylic acid will be low and the solder wettability thereby will be lowered. The reason that the amount of the alcohol is from 0 to 30% by mass of the flux is that, if the alcohol amount is larger than 30% by weight, it causes curing failure in encapsulation with resin especially with silicone gel.

Preferably, the total amount of the epoxy resin and the organic carboxylic acid is from 75 to 85% by mass of the flux, and the amount of the alcohol is from 15 to 25% by mass thereof. More preferably, the total amount of the epoxy resin and the organic carboxylic acid is 77% by mass of the flux, and the alcohol amount is 23% by mass thereof. When the flux to be in the solder composition of the invention is formulated as described above, it evades several problems. That is, most of the carboxylic acid serving as an activator is not consumed for the curing reaction with the epoxy resin before the SnZn alloy melts, as would prevent the carboxylic acid from maintaining its activity. Moreover, the flux does not lose its flowability, as would cause the solder wettability to be lowered.

Soldering with the solder composition of the invention that can be attained with no flux removal from the composition is described below. When the solder composition of the invention is used for soldering, for example, for reflow soldering of electronic parts, the epoxy flux first begins to react before the lead-free SnZn solder therein melts. The activator, organic carboxylic acid, cleans the object face to be bonded by soldering. Next, with the increase in its temperature, the lead-free solder melts to solder electronic parts to the conductor pattern of a printed circuit board. Even at this stage, the flux curing reaction continues. Then, almost at the same time that the soldering is finished, or when heated after the soldering to cure the encapsulation resin), the reaction is terminated. At this time, the cured epoxy resin covers the soldered area to thereby reinforce the bonding part.

Some excess carboxylic acid-containing epoxy flux residue may remain in the soldered area on the printed circuit board. However, no washing is required. The printed circuit board is directly encapsulated with resin (e.g., epoxy resin, silicone gel) around the bonded parts, whereupon the carboxylic acid still remaining in the flux residue reacts with the encapsulation resin. As a result, almost all the carboxylic acid is consumed by the curing reaction and therefore is no more active for corrosion. In addition, the main component, epoxy resin in the epoxy flux, firmly bonds to the encapsulation resin. Accordingly, when the epoxy flux of this type is used, it ensures good solder wettability. Even though the flux residue is not removed after used in soldering, the insulation reliability is assured with no failure in curing of encapsulation resin.

EXAMPLES

The solder composition of the invention is described concretely with reference to the following Examples and Comparative Examples.

Example 1

4.42 g of cis-4-cyclohexene-1,2-dicarboxylic acid (m.p. 167° C.; molecular weight 170) was ground in a mortar into fine powder. This powder was added to a mixture of 4.33 g of triethylene glycol and 10 g of epoxy resin AER260 (bisphenol A-type epoxy resin having an epoxy equivalent of 192 g/eq, by Asahi Kasei Epoxy), at room temperature (25° C.), and mixed to prepare a flux. In the flux, the epoxy resin and the carboxylic acid were so formulated that the epoxy group could be 1 equivalent relative to 1 equivalent of the carboxyl group. The flux was added to an alloy of Sn8Zn3Bi at room temperature (25° C.) and mixed to prepare a cream solder composition. The solder alloy content of the solder composition was 88% by mass. Since cis-4-cyclohexene-1,2-dicarboxylic acid in the cream solder is a low-molecular-weight organic carboxylic acid, the carboxylic acid reacted with Zn to form a low-molecular-weight salt. The carboxylic acid was dispersed in the solder composition as a solid at room temperature.

One hour after preparation of the solder composition, the viscosity of the solder composition was measured at 230 Pa·s. After storing the solder composition in a refrigerator (5° C.) for 3 months, the viscosity of the solder composition was 240 Pa·s, thus almost the same as that of the fresh composition. This confirmed that the solder composition changed little over time. On the other hand, the solder wettability was good, and even though the flux residue was not actively removed after soldering, no curing failure occurred in encapsulation with silicone gel. Not requiring flux removal, the lead-free solder ensured good solderability.

Example 2

Soldering was tried in the same manner as in Example 1, for which, however, 3.83 g of L-glutamic acid (m.p. about 200° C.; molecular weight 147) was used in place of cis-4-cyclohexene-1,2-dicarboxylic acid in Example 1. Since L-glutamic acid in the cream solder is a low-molecular-weight organic carboxylic acid, the carboxylic acid reacted with Zn to form a low-molecular-weight salt. The carboxylic acid was dispersed in the solder composition as a solid at room temperature.

One hour after this solder composition was prepared, the viscosity of the solder composition was measured at 260 Pa·s. After the solder composition had been stored in a refrigerator (5° C.) for 3 months, the viscosity of the solder composition was 265 Pa·s, thus almost the same as that of the fresh composition. This confirms that the solder composition had changed little over time. On the other hand, the solder wettability was good, and even though the flux residue was not actively removed after soldering, no curing failure occurred in encapsulation with silicone gel. Not requiring flux removal, the lead-free solder ensured good solderability.

Example 3

Soldering was tried in the same manner as in Example 1, for which, however, 4.16 g of 2,2-dimethylglutaric acid (m.p. 84° C.; molecular weight 160) that had been formed into microcapsules was used in place of cis-4-cyclohexene-1,2-dicarboxylic acid of Example 1. Epoxy resin not reactive with Zn at room temperature (25° C.) was used for the shell material of the microcapsules, and the acid was formed into microcapsules through interfacial polymerization. The size of the microcapsules was 2 μm; and the capsule wall thickness thereof was 0.2 μm.

One hour after the solder composition was prepared, the viscosity of the solder composition was measured at 250 Pa·s. After the solder composition had been stored in a refrigerator (5° C.) for 3 months, the viscosity of the solder composition was 250 Pa·s, thus the same as that of the fresh composition. This confirmed that the solder composition had changed little over time. On the other hand, the solder wettability was good, and even though the flux residue was not actively removed after soldering, no curing failure occurred in encapsulation with silicone gel. Not requiring flux removal, the lead-free solder ensured good solderability.

Comparative Example 1

5.80 g of triethylene glycol was added to 9.32 g of benzoyl-D-tartaric acid (m.p. 155° C.; molecular weight 358), and phthalic acid was heated at about 130° C. and dissolved. Next, this was cooled to 100° C. or lower, and then 10 g of epoxy resin AER260 (bisphenol A-type epoxy resin having an epoxy equivalent of 192 g/eq, by Asahi Kasei Epoxy) was added to it and stirred to provide a flux. In the flux, the epoxy resin and the carboxylic acid were so formulated that the epoxy group could be 1 equivalent relative to 1 equivalent of the carboxyl group. The flux was cooled to room temperature (25° C.), and added to an alloy of Sn8Zn3Bi and mixed to prepare a cream solder composition. The solder alloy content of the solder composition was 88% by mass. Since benzoyl-D-tartaric acid is liquid at room temperature in the solder composition, it readily reacted with the Zn in the solder alloy. When reacted with Zn, the acid formed a salt having a large molecular weight.

One hour after preparation of this solder composition, the viscosity of the solder composition was measured at 260 Pa·s. After being stored in a refrigerator (5° C.) for 10 days, the solder composition was no more creamy, but formed a solid. It was thus apparent that the solder composition had changed over time.

The invention claimed is:

1. A solder composition which is lead-free, which is a cream and is printable, and which has stabilized viscosity and solderability, comprising:
   a metal powder consisting of a SnZn alloy; and
   a solder flux consisting of:
      an epoxy resin;
      microcapsules consisting of particles of organic carboxylic acid encapsulated with a resin selected from a group consisting of epoxy, polyimide, polycarbonate, polyamide, polyester, polyurea, polyolefin, and polysulfone resins; and
      a solvent which is a glycol, wherein the presence of the organic carboxylic acid encapsulated with a resin as microcapsules suppresses reactivity of zinc in the SnZn alloy with the organic carboxylic acid so that viscosity and solderability are stabilized.

2. The solder composition according to claim 1, wherein the epoxy resin is selected from the group consisting of bisphenol A-type epoxy resin, bisphenol F-type epoxy resin, novolak-type epoxy resin, alicyclic epoxy resin, and their mixtures.

3. The solder composition according to claim 1, wherein the organic carboxylic acid is selected from the group consisting of saturated aliphatic dicarboxylic acid, unsaturated aliphatic dicarboxylic acid, cycloaliphatic dicarboxylic acid, amino group-containing carboxylic acid, hydroxyl group-containing carboxylic acid, heterocyclic dicarboxylic acid, and their mixtures.

4. The solder composition according to claim 1, wherein the organic carboxylic acid has a melting point ranging from 130 to 220° C.

5. The solder composition according to claim 1, wherein the solder flux contains a combined content of the epoxy resin and the organic carboxylic acid that ranges from 70 to 100% by mass based on mass of the solder flux, and content of the glycol ranges up to 30% by mass based on mass of the solder flux, and wherein the epoxy resin and the organic carboxylic acid are so formulated in the solder flux that the organic carboxylic acid ranges from 0.8 to 2.0 equivalents relative to 1.0 equivalent of the epoxy resin therein.

6. The solder composition according to claim 1, wherein the organic carboxylic acid is selected from the group consisting of cyclohexene-dicarboxylic acid and dimethylglutaric acid.

7. The solder composition according to claim 1, wherein the epoxy resin is selected from the group consisting of bisphenol F-type epoxy resin, novolak-type epoxy resin, alicyclic epoxy resin, and their mixtures.

8. A solder composition which is lead-free, which is a cream and is printable, and which has stabilized viscosity and solderability, comprising:
   a solder flux consisting of:
      an epoxy resin;
      an organic carboxylic acid; and
      a solvent which is a glycol; and
   microcapsules comprising particles of a metal powder consisting of a SnZn alloy encapsulated with a resin selected from a group consisting of epoxy, polyimide, polycarbonate, polyamide, polyester, polyurea, polyolefin, and polysulfone resins,
   wherein the presence of the SnZn alloy encapsulated with a resin as microcapsules suppresses reactivity of zinc in the SnZn alloy with the organic carboxylic acid so that viscosity and solderability of the solder composition are stabilized.

9. The solder composition according to claim 8, wherein the epoxy resin is selected from the group consisting of bisphenol A-type epoxy resin, bisphenol F-type epoxy resin, novolak-type epoxy resin, alicyclic epoxy resin, and their mixtures.

10. The solder composition according to claim 8, wherein the organic carboxylic acid is selected from the group consisting of saturated aliphatic dicarboxylic acid, unsaturated aliphatic dicarboxylic acid, cycloaliphatic dicarboxylic acid, amino group-containing carboxylic acid, hydroxyl group-containing carboxylic acid, heterocyclic dicarboxylic acid, and their mixtures.

11. The solder composition according to claim 8, wherein the organic carboxylic acid has a melting point ranging from 130 to 220° C.

12. The solder composition according to claim 8, wherein the solder flux contains a combined content of the epoxy resin and the organic carboxylic acid that ranges from 70 to 100% by mass based on mass of the solder flux, and content of the glycol ranges up to 30% by mass based on mass of the solder flux, and wherein the epoxy resin and the organic carboxylic acid are so formulated in the solder flux that the organic carboxylic acid ranges from 0.8 to 2.0 equivalents relative to 1.0 equivalent of the epoxy resin therein.

13. The solder composition according to claim 8, wherein the organic carboxylic acid is selected from the group consisting of cyclohexene-dicarboxylic acid and dimethylglutaric acid.

14. The solder composition according to claim 8, wherein the epoxy resin is selected from the group consisting of bisphenol F-type epoxy resin, novolak-type epoxy resin, alicyclic epoxy resin, and their mixtures.

* * * * *